United States Patent
Johnson et al.

(10) Patent No.: US 10,599,249 B2
(45) Date of Patent: Mar. 24, 2020

(54) SENSOR DEVICE AND SENSING METHOD BASED ON AN ELECTROACTIVE MATERIAL

(71) Applicant: KONINKLIJKE PHILIPS N.V., Eindhoven (NL)

(72) Inventors: Mark Thomas Johnson, Arendonk (BE); Cornelis Petrus Hendriks, Eindhoven (NL); Daan Anton van den Ende, Breda (NL); Achim Hilgers, Alsdorf (DE)

(73) Assignee: Koninklijke Philips N.V., Eindhoven (NL)

( * ) Notice: Subject to any disclaimer, the term of this patent is extended or adjusted under 35 U.S.C. 154(b) by 17 days.

(21) Appl. No.: 16/077,100

(22) PCT Filed: Feb. 13, 2017

(86) PCT No.: PCT/EP2017/053097
§ 371 (c)(1),
(2) Date: Aug. 10, 2018

(87) PCT Pub. No.: WO2017/148687
PCT Pub. Date: Sep. 8, 2017

(65) Prior Publication Data
US 2019/0050102 A1    Feb. 14, 2019

(30) Foreign Application Priority Data
Feb. 29, 2016 (EP) ...................................... 16157852

(51) Int. Cl.
*G06F 3/041* (2006.01)
*H01L 41/113* (2006.01)
*H01L 41/193* (2006.01)

(52) U.S. Cl.
CPC .......... *G06F 3/0414* (2013.01); *G06F 3/0416* (2013.01); *H01L 41/1132* (2013.01); *G06F 2203/04104* (2013.01); *H01L 41/193* (2013.01)

(58) Field of Classification Search
CPC ................. G06F 3/0414; G06F 3/0416; G06F 2203/04104; H01L 41/1132; H01L 41/193
See application file for complete search history.

(56) References Cited

U.S. PATENT DOCUMENTS

| 4,634,917 A | 1/1987 | Dvorsky et al. |
| 2006/0103634 A1 | 5/2006 | Kim et al. |

(Continued)

FOREIGN PATENT DOCUMENTS

| EP | 2090965 A1 | 8/2009 |
| WO | 2011158154 A2 | 12/2011 |
| WO | 2015125119 A1 | 8/2015 |

*Primary Examiner* — Rodney Amadiz

(57) ABSTRACT

A sensor device comprising a passive matrix array of electroactive sensor elements arranged in rows and columns. In one example, each sensor element generates a binary sensor signal such that a total signal at each row and at each column enables any pattern of external inputs to be determined. This provides a first way to determine a pattern of sensor elements which are sensing an input using a passive matrix addressing scheme. In another example, each sensor element generates a sensor signal with a different frequency characteristic. This provides another way to enable any pattern of external inputs to be determined.

15 Claims, 7 Drawing Sheets

(56) References Cited

U.S. PATENT DOCUMENTS

| | | |
|---|---|---|
| 2007/0146339 A1 | 6/2007 | Yang et al. |
| 2008/0122589 A1 | 5/2008 | Ivanov |
| 2010/0053116 A1 | 3/2010 | Daverman et al. |
| 2011/0141026 A1 | 6/2011 | Joquet et al. |
| 2011/0316798 A1* | 12/2011 | Jackson ............... G06F 3/016 345/173 |
| 2012/0086651 A1 | 4/2012 | Kwon et al. |
| 2012/0313888 A1 | 12/2012 | Lee et al. |
| 2015/0034469 A1 | 2/2015 | Xue |

* cited by examiner

| m/n | 0 | 1 | 0 | 0 |
|---|---|---|---|---|
| 0 | | | | |
| 1 | | 1 | | |
| 0 | | | | |
| 0 | | | | |

| m/n | 0 | 1 | 1 | 0 |
|---|---|---|---|---|
| 0 | | | | |
| 2 | | 1 | 1 | |
| 0 | | | | |
| 0 | | | | |

| m/n | 0 | 2 | 2 | 0 |
|---|---|---|---|---|
| 0 | | | | |
| 2 | | 1 | 1 | |
| 2 | | 1 | 1 | |
| 0 | | | | |

| m/n | 0 | 2 | 3 | 0 |
|---|---|---|---|---|
| 0 | | | | |
| 2 | | 1 | 1 | |
| 2 | | 1 | 1 | |
| 1 | | | 1 | |

| m/n | 1 | 1 | 3 | 0 |
|---|---|---|---|---|
| 0 | | | | |
| 2 | 1 | | 1 | |
| 2 | | 1 | 1 | |
| 1 | | | 1 | |

FIG. 5

SENSOR DEVICE AND SENSING METHOD BASED ON AN ELECTROACTIVE MATERIAL

CROSS-REFERENCE TO PRIOR APPLICATIONS

This application is the U.S. National Phase application under 35 U.S.C. § 371 of International Application No. PCT/EP2017/053097, filed on Feb. 13, 2017, which claims the benefit of European Application Serial No. 16157852.1, filed Feb. 29, 2016. These applications are hereby incorporated by reference herein, for all purposes.

FIELD OF THE INVENTION

This invention relates to sensor devices which make use of electroactive materials, such as piezoelectric materials and electroactive polymers, and to sensing methods using such devices.

BACKGROUND OF THE INVENTION

Piezoelectric materials have been well known for many decades, one most common example being a piezoelectric ceramic, lead zirconate titanate.

Electroactive polymers (EAP) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

Devices using electroactive polymers can be subdivided into field-driven and ionic-driven materials.

Examples of field-driven EAPs are dielectric elastomers, electrostrictive polymers (such as PVDF based relaxor polymers or polyurethanes) and liquid crystal elastomers (LCE).

Examples of ionic-driven EAPs are conjugated polymers, carbon nanotube (CNT) polymer composites and Ionic Polymer Metal Composites (IPMC).

Field-driven EAP's are actuated by an electric field through direct electromechanical coupling, while the actuation mechanism for ionic EAP's involves the diffusion of ions. Both classes have multiple family members, each having their own advantages and disadvantages.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the electroactive polymer, or it may result from asymmetry in the properties of the carrier layer, or a combination of both.

In a sensing application, deformation induced by an external force to be sensed can give rise to a measurable change in impedance. Alternatively, some electroactive materials such as piezoelectric materials, generate electrical charge in response to the external force stimulus.

In certain applications, an array of sensors can be useful for example to measure the contact area between a device and the human body. For instance, the contact area between a touch panel and a human finger is measured in the system described in US 2012/0086651. This document describes a touch panel which includes a passive matrix of piezoelectric polymer sensors. The shape of the sensing electrodes is a plurality of electrode lines arranged on the upper and lower surfaces of the piezoelectric layer, in such a manner that the upper and lower electrode lines are perpendicular to each other.

In order to determine unique position patterns in such a matrix it is necessary to read out sensor elements individually, or to sequentially scan rows and columns. This requires complicated wirings (which individually connect all pixels) and/or electronics (row and column switches).

This complexity can be avoided by performing a parallel read-out of rows and columns, but the penalty is that it is no longer possible to determine unique position patterns. Thus, a conventional passive matrix concept does not enable unique position patterns to be determined with parallel read-out of rows and columns.

There is therefore a need for a simple matrix addressing scheme which enables a detection of a pattern applied to a sensor array.

SUMMARY OF THE INVENTION

The invention is defined by the claims.

According to examples in accordance with a first aspect of the invention, there is provided a sensor device comprising:

a passive matrix array of electroactive sensor elements arranged in rows and columns; and an array of row lines and an array of column lines, with a sensor element at each intersection, wherein each sensor element generates a sensor signal when an external input is sensed, wherein each sensor element generates a binary sensor signal such that a total sensor array signal at each row and at each column enables any pattern of external inputs to be determined.

In this device, it is possible to determine a pattern of sensor elements which are sensing an input using a passive matrix addressing scheme. In such a passive matrix scheme, the sensor elements remain coupled to the row and column conductors, without any isolating switches.

The sensor elements generate a sensor current. By arranging the currents to take only (approximately) only two possible values, for example zero and an on-current, it is possible to determine how many active elements are in each row and in each column. In this way, a unique pattern of active elements can be identified. The sensor element generates a binary raw output signal, which is then provided on or between the row and column lines.

Each sensor element may comprise a bistable element having two configurations.

According to examples in accordance with a second aspect of the invention, there is provided a sensor device comprising:

a passive matrix array of electroactive sensor elements, wherein each sensor element generates a sensor signal when an external input is sensed, wherein each sensor element generates a sensor signal with a different frequency characteristic such that individual sensor elements can be identified from a combined sensor signal, thereby to enable any pattern of external inputs to be determined.

In this device, it is again possible to determine a pattern of sensor elements which are sensing an input using a passive matrix addressing scheme. The sensor elements each generate an output with a particular identifiable frequency characteristic. By analyzing the combined sensor signal generated by the sensor array, the individual components can be identified.

The two aspects thus address the common problem of enabling a passive matrix scheme to be used to identify all sensor elements that are actuated, no matter what pattern of elements is actuated. The array of sensor elements may be read out simultaneously in both aspects.

In the second aspect, each sensor element may comprise a current generating element which generates an output current in response to an external input, and a reactive load circuit which converts the output current into an output signal with a frequency characteristic.

The reactive load circuit for example comprises a resonant circuit, wherein the resonant circuit of each sensor element has a different set of component values. These different component values give the desired different frequency characteristic.

The resonant circuit may for example comprise a parallel LC circuit, although many other resonant circuit designs are possible.

The sensor element may further comprise a diode between the current generating element and the load circuit. This limits the current flow.

In order to create the combined signal for analysis, a summing circuit may be used for summing the sensor signals.

The examples above are based on an electrical frequency characteristic. An alternative is for each sensor element to have a different mechanical resonance frequency or a different mechanical relaxation time. These different mechanical frequency characteristics are then identifiable in the sensor signals generated. Thus, they are mechanical resonance characteristics, but they are again identified in the electrical signal generated by the sensor elements.

The first aspect also provides a sensing method for sensing a pattern of external inputs to a sensor device which comprises a passive matrix array of electroactive sensor elements arranged in rows and columns and an array of row lines and an array of column lines, with a sensor element at each intersection, wherein the method comprises:

generating a sensor signal at each sensor element when an external input is sensed, wherein the sensor element signal comprises a binary sensor signal; and from a total sensor signal at each row and at each column determining the pattern of external inputs.

The second aspect also provides a sensing method for sensing a pattern of external inputs to a sensor device which comprises a passive matrix array of electroactive sensor elements, wherein the method comprises:

generating a sensor signal at each sensor element with a different frequency characteristic; and from a combined sensor signal, identifying individual sensor elements, thereby determining the pattern of external inputs.

Each sensor element may comprise a current generating element which generates an output current in response to an external input, and wherein the method comprises converting the output current into an output signal with a frequency characteristic using a load circuit.

The method may comprise identifying the sensor elements in the summed sensor signals using frequency spectrum analysis. The method may instead comprise providing each sensor element with a different mechanical resonance frequency or a different mechanical relaxation time.

BRIEF DESCRIPTION OF THE DRAWINGS

Examples of the invention will now be described in detail with reference to the accompanying drawings, in which:

FIG. 5 shows how to use the sensor element of FIG. 4 in a sensor array;

DETAILED DESCRIPTION OF THE EMBODIMENTS

The invention provides a sensor device comprising a passive matrix array of electroactive sensor elements arranged in rows and columns. In one example, each sensor element generates a binary sensor signal such that a total signal at each row and at each column enables any pattern of external inputs to be determined. This provides a first way to determine a pattern of sensor elements which are sensing an input using a passive matrix addressing scheme. In another example, each sensor element generates a sensor signal with a different frequency characteristic. This provides another way to enable any pattern of external inputs to be determined.

In order to determine unique position patterns in a passive matrix it is normally necessary to read-out pixels individually, or to sequentially scan rows and columns. This requires complicated wiring (which individually connects all pixels) and/or electronics such as row and column switches.

This complexity can be avoided by using a parallel read-out of rows and columns, but the penalty is that it is no longer possible to determine unique position patterns.

This is illustrated in FIG. 3 which shows a 2×2 matrix for example of piezoelectric sensors, with parallel read-out of columns and rows. The array of sensor elements thus comprises a set of two row conductors and two column conductors, with a sensor element at the intersection of each row and column.

Figure 1:
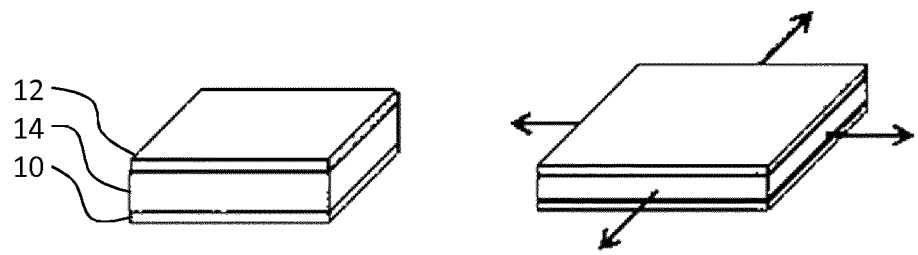
FIG. 1 shows a known electroactive polymer device which is not clamped.
Figure 2:
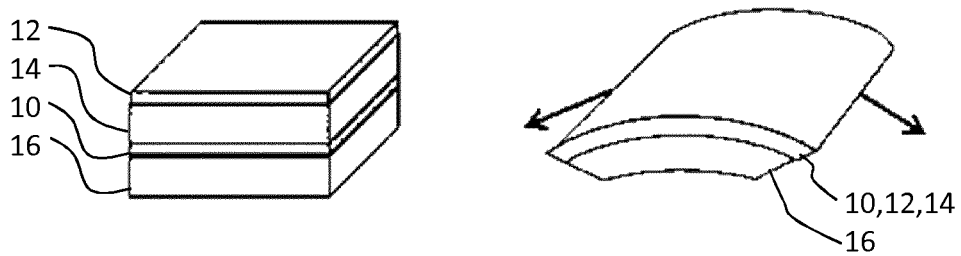
FIG. 2 shows a known electroactive polymer device which is constrained by a backing layer.
Figure 3A:
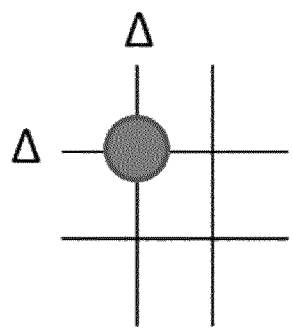
FIG. 3 is used to show the problem of a standard passive matrix addressing scheme.
Figure 3B:
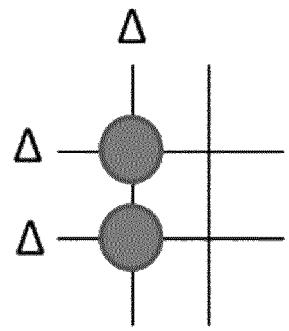
Figure 3C:
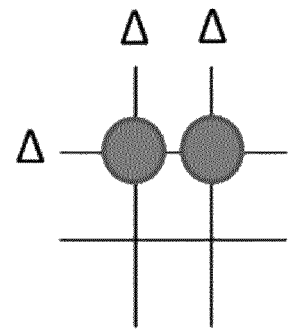

If one pixel in this matrix is touched as shown in FIG. 3A, an electric current flows through the row and column lines which connect to the upper and lower electrodes of each sensor. The unique location of the pixel can be determined by the row and column which show a current flow. If two pixels in the same row or column are touched as shown in FIG. 3B and FIG. 3C, the unique locations of the pixels can again be determined by the row and column numbers of the electrode lines which experience a current flow.

Figure 3D:
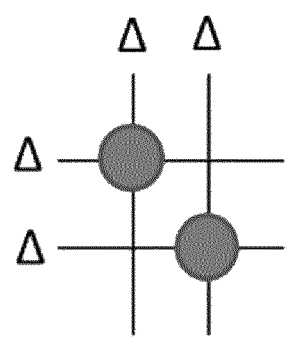
Figure 3E:
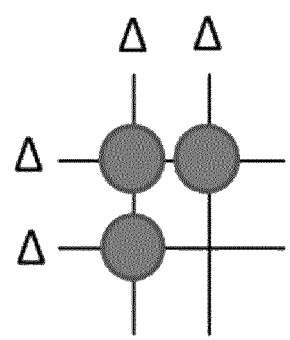
Figure 3F:
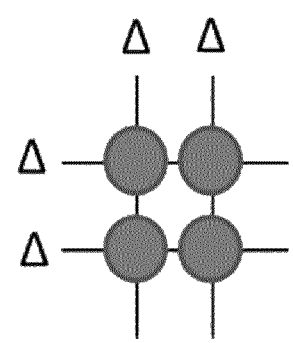

However, if two pixels in different rows and columns are touched as shown in FIG. 3D, or if three or more pixels are touched as shown in FIGS. 3E and 3F, it is no longer possible to determine their unique positions.

This problem can be addressed, in accordance with some examples of the invention, by providing a signature to the pixels. The requirement of the pixel signature is that it is not sensitive to the characteristics of the external actuation to the sensor (e.g. touch), such as the level of force, time and speed, because these characteristics can vary from pixel-to-pixel.

The options for a pixel signature are the pulse amplitude (voltage, current), pulse shape (voltage, current), pulse direction (current flows in or out of an electrode line) or pulse frequency.

A first example is explained with reference to FIG. 4, based on a mechanically bitable design.

In this example, each sensor element generates a binary sensor current and the current (i.e. the two levels) for each sensor element is the same, such that a total current flowing at each row and at each column enables any pattern of external inputs to be determined.

This requires a modification to the sensor element design. In particular, an electroactive sensor typically generates an analogue output which is a function of the force applied or the distance over which a force is applied to the sensor element. To create a binary response, by which is meant there is one signal value for no sensing and another signal value for sensing an external input, a mechanical design may be used.

Figures 4A, 4B:
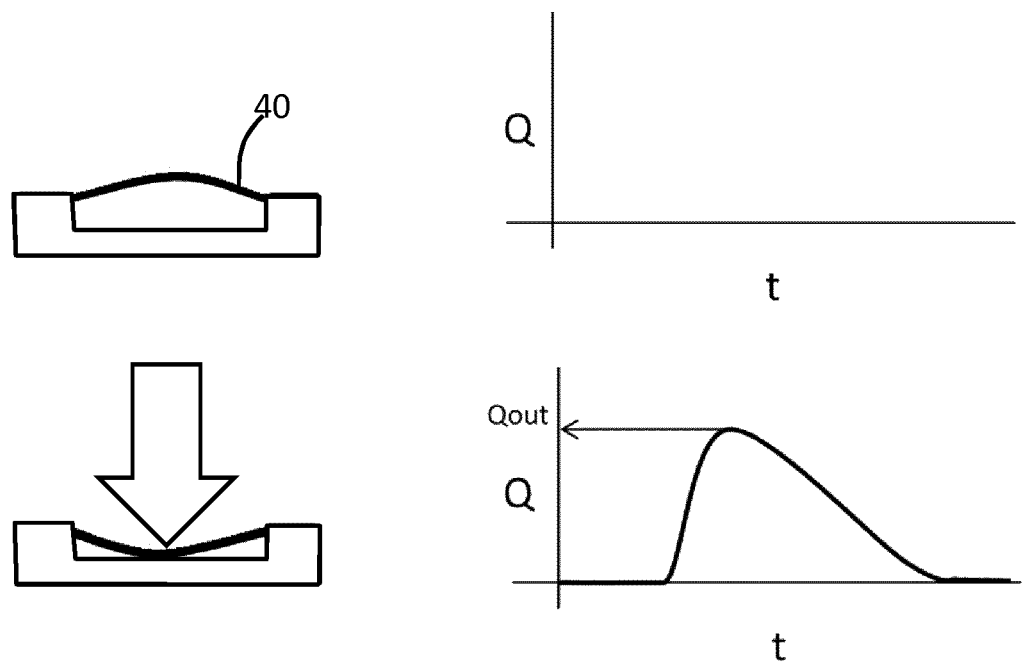
FIG. 4 shows a first example of sensor element which may be employed in the device of the invention, as well as its electrical response.

FIG. 4A shows a bistable sensor element 40. It has a non-actuated position shown in the top image, and upon actuation by a sufficient force, it snaps to the actuated position shown in the bottom image. The movement of the sensor element between these positions generates the electrical signal, but it is essentially the same for any actuation. It starts when a threshold has been reached and has a nearly fixed duration until the new position is adopted. There is thus a signature for each sensor element in the form of a mechanical bistable response to a light force, making use of a snap through effect. The sensor response is always the same because of this bi-stable effect.

The sensor element may be biased to reset itself when the external stimulus is removed, or it may be reset by driving the sensor element as an actuator. This defines a bistable actuator design.

In order to create the bistable effect, a mechanical element may be used, which retains the element in one state when there is no actuation and external actuation below a threshold, but then allows it to switch.

One example is a mechanically bistable layer which can snap between two stable states, such as as a pressed metal sheet. For example, it may toggle between a convex and a concave state, or equivalently an upward projecting and a downward projecting state. It may be formed as a lid over the sensor element.

FIG. 4B shows the corresponding output signal. While the sensor remains in the non-sensing state, there is no output signal, even if there is an external stimulus which is insufficient to reach the threshold.

When the threshold is reached, the sensor element switches to the sense state, and this switching generates the current pulse shown.

Figure 4C:
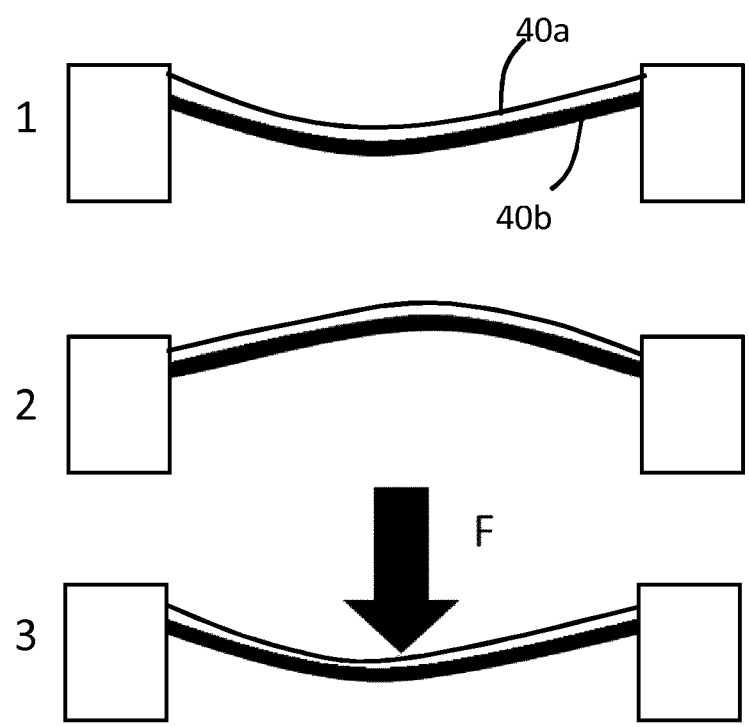

FIG. 4C shows that the sensor element 40 may comprise a two layer structure having an electroactive layer 40a over a substrate sheet 40b. This functions as an actuator and as a sensor. When the EAP is actuated the EAP-substrate combination transfers from state 1 to state 2 as shown in FIG. 4C. This functions as a reset procedure. An external force causes the sensor element 40 to snap into the depressed state as shown as state 3, and this depression generates the charge pulse shown in FIG. 4B.

By using both actuation and sensing, a reset may be performed between each sensing function.

By making the output for all sensor elements the same within suitable margins (the pulse shown in FIG. 4B) it is possible to infer when more sensor elements in a row or column have been operated by considering the amplitude of the output. A higher output indicates more sensor elements have been which are pressed. This addresses the problem that in a standard sensor, the amplitude is not always be representative of the number of sensor elements pressed.

The output charge (shown as Qout in FIG. 4B) is nearly independent of the applied force providing the force exceeds the threshold for the snap through. Assuming a normalized value of Qout=1, FIG. 5 shows a digital scheme which may be used to determine the activated positions.

Each table in FIG. 5 shows the sensor elements which have been externally operated by a using "1" in the main table. The top row and left column shows the current flowing at the column and row conductors for a 4×4 array of sensor elements. Each possible pattern (only 5 are shown of the $2^{16}$ possible patterns) creates a unique set of row and column current readings. Thus, any pattern of external inputs can be determined.

Figure 6:
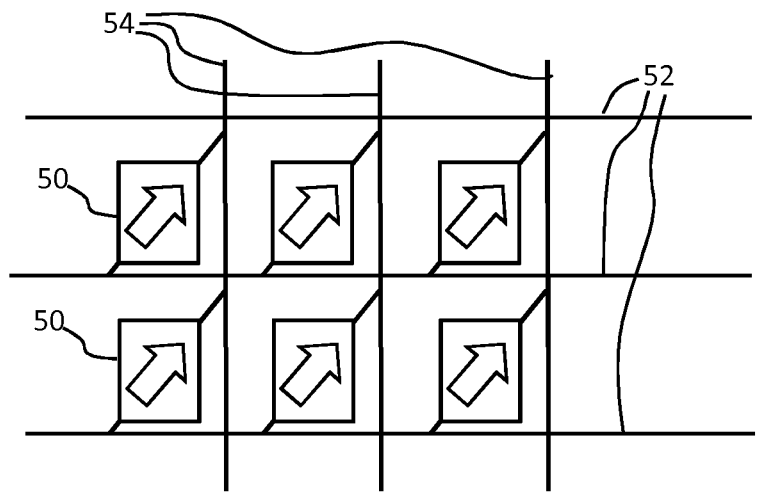
FIG. 6 show a passive matrix array of sensors based on the design of FIG. 4.

FIG. 6 shows the passive matrix array of electroactive sensor elements 50 arranged in rows and columns. There is an array of row lines 52 and an array of column lines 54, with a sensor element 50 at each intersection. A total sensor array signal flowing into or out of each row, and into or out of each column enables any pattern of external inputs to be determined as explained above.

The approach above is based on creating a bistable output from each sensor element by constraining the mechanical response of each sensor element. An alternative is to create the desired bistable or binary response by electrical means. For example an upper limit on the electrical output may be imposed, for instance using a Zener diode to limit an output voltage (with conversion of the output current to voltage). Similarly, a lower limit may be imposed before an output is generated, again using a threshold device. Thus, the output may be constrained to fall with a desired range of values.

The approach above is based on making the output from each sensor element the same, so that the number of sensors elements which is producing a signal can be counted. Of course this approach renders the sensing to a binary scheme so that analog content is lost.

A second approach is explained with reference to FIG. 7. This approach is based on making each sensor element output uniquely identifiable. In particular, each sensor element is arranged to generate a sensor signal with a different frequency characteristic such that individual sensor elements can be identified from a combined sensor signal. This again enables any pattern of external inputs to be determined.

Figure 7:
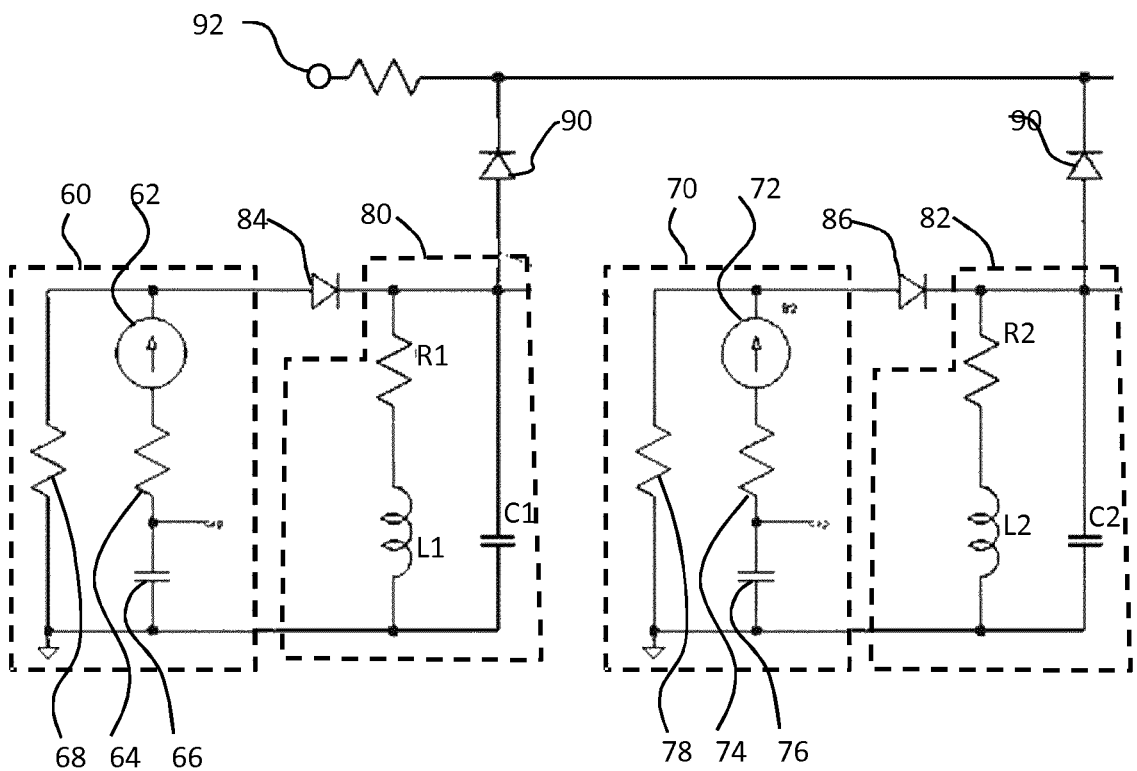
FIG. 7 shows a second example of sensor element which may be employed in the device of the invention.

FIG. 7 is based on providing a unique resonant frequency to the sensor element by adding a defined load in the form of a complex impedance. Each sensor element can then be identified by means of its own unique frequency response. The resonant frequencies can be tuned by selecting passive components, which are different in their component values (such as inductances or capacitances).

When a sensor element is activated, a current is generated, which is then used to excite an oscillating resonance current in the load. By simply adding the outputs from the sensor elements, all the generated oscillations may be combined and may then be read out in the analog domain for example using lock-in amplifiers or analogue filters or in the digital domain using Fast Fourier Transform algorithms after analog to digital conversion.

In FIG. 7, two sensor elements 60, 70 are shown. Each sensor element 60, 70 is modeled as a current source 62, 72 in series with a resistance 64, 74 and capacitance 66, 76, as well as a parallel resistance 68, 78.

The sensor elements are typically arranged in rows and columns to form an array. However, in this case there is no need to consider combined individual row signals or column signals, since each sensor element has a unique signal pattern. Instead, all sensor elements ultimately connect to a single output. There is thus more freedom to position the sensor elements in a non-uniform array.

Each sensor element is associated with a respective complex load 80, 82 which in this example comprise parallel LC-circuits. The LC circuits comprise an inductor and resistor in series L1, R1 and L2, R2 and a capacitor C1, C2 in parallel with the resistor-inductor branch. The LC circuits differ only in the capacitor values.

A respective diode 84, 86 is provided between each sensor element 60, 70 and its associated load circuit 80, 82, protecting the sensor element from high over-voltages.

In the example shown, the oscillating circuit responses are combined by means of a simple modulating (adding) circuit based on two additional diodes 90 before generating a combined output at the node 92.

For the purposes of simulation, the mechanical input to be sensed has been simulated as rectangular voltage pulse which activates the current sources 62, 72 of each sensor element 60, 70.

Figure 8:
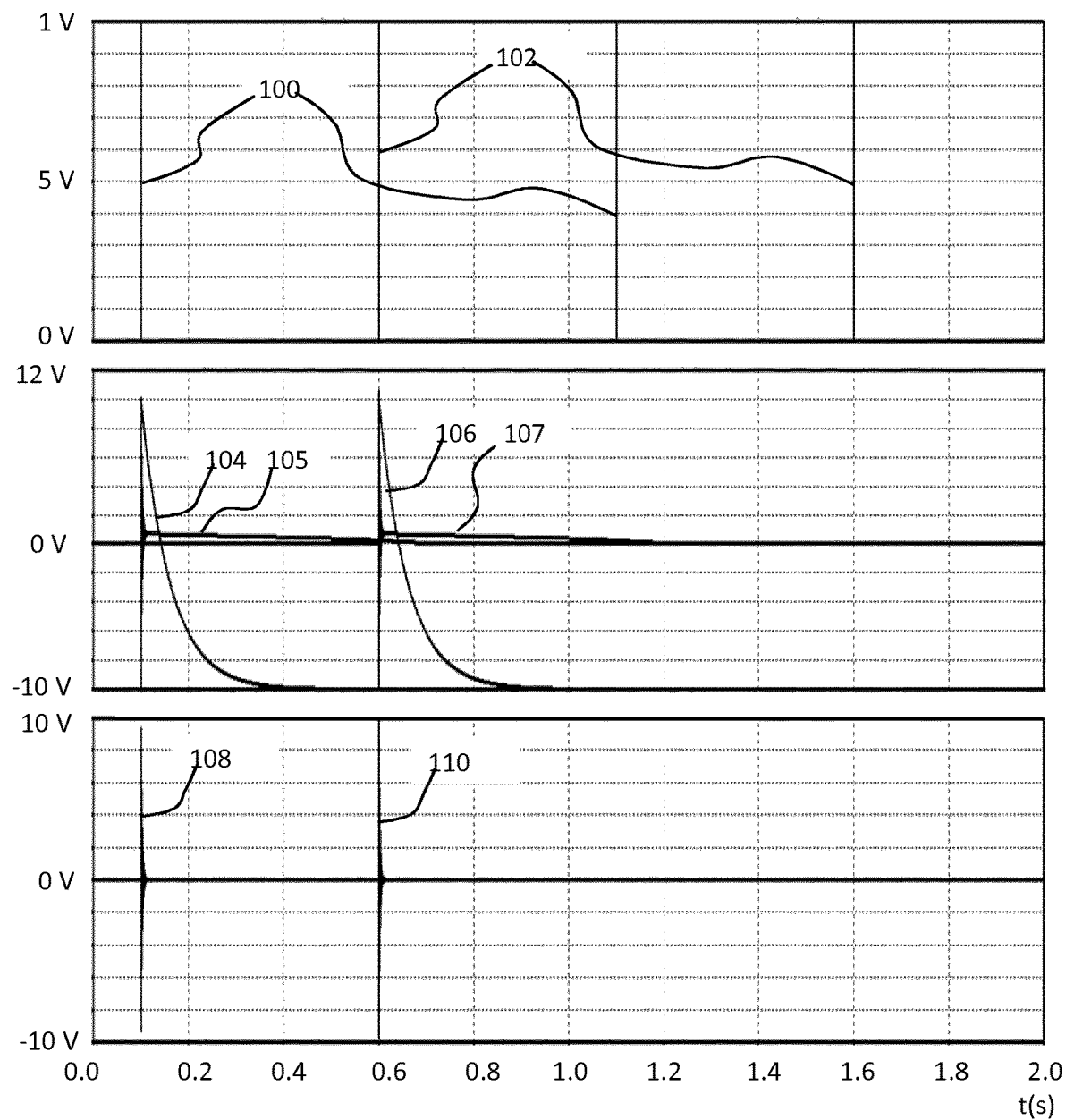
FIG. 8 shows the electrical response of the sensor element of FIG. 7.

FIG. 8 shows the result of a circuit simulation.

The top image shows the mechanical sensor input provided to two sensor elements. The input for a first sensor element is shown as 100, and the rising and falling edges can be seen. The input for a second sensor element is shown as 102, and the rising and falling edges can again be seen. The two activation periods overlap.

When the current source of each sensor element is activated an exponential decreasing current is generated, as shown by plots 104 and 106 in the middle image. Plots 100 and 104 are for sensor element 60. The trace 105 shows the voltage on the anode of diode 84, i.e, at the output of the sensor. Plots 102 and 106 are for sensor element 70. The trace 107 shows the voltage on the anode of diode 86, i.e., at the output of the sensor.

As a function of the sensor element currents, the generated oscillating responses are shown in the lower image, with plot 108 for the first sensor element and plot 110 for the second sensor element.

Figure 9:
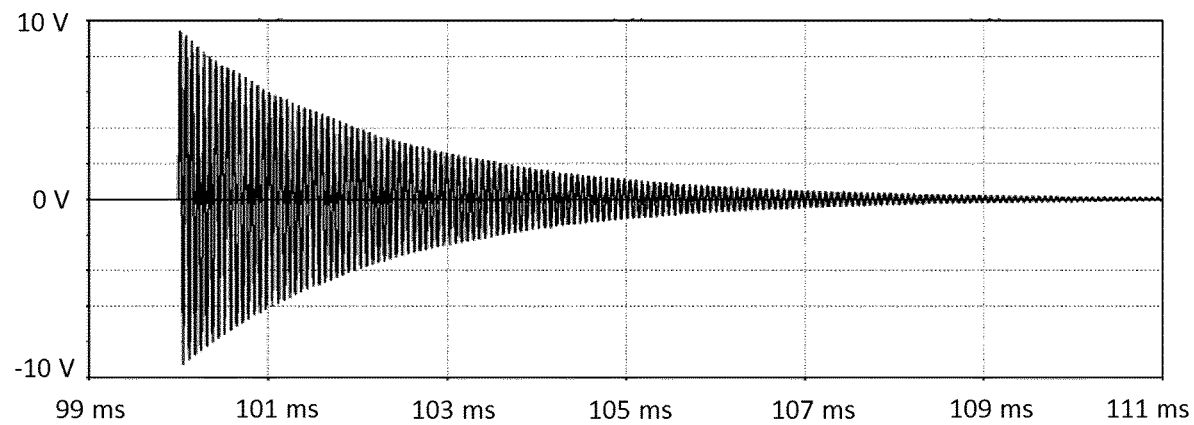
FIG. 9 is an enlarged view of one part of a plot of FIG. 8.

A magnified part of the oscillating response 108 is shown in FIG. 9. The oscillation can be seen, with the exponentially decreasing outer envelope, and it has a characteristic frequency.

To identify the differences between the two oscillating responses several known approaches can be taken. For example, a Fast Fourier Transformation (FFT) has been used to generate the frequency responses from the transient simulation data above. The results are shown in FIGS. 10 and 11.

Figure 10:
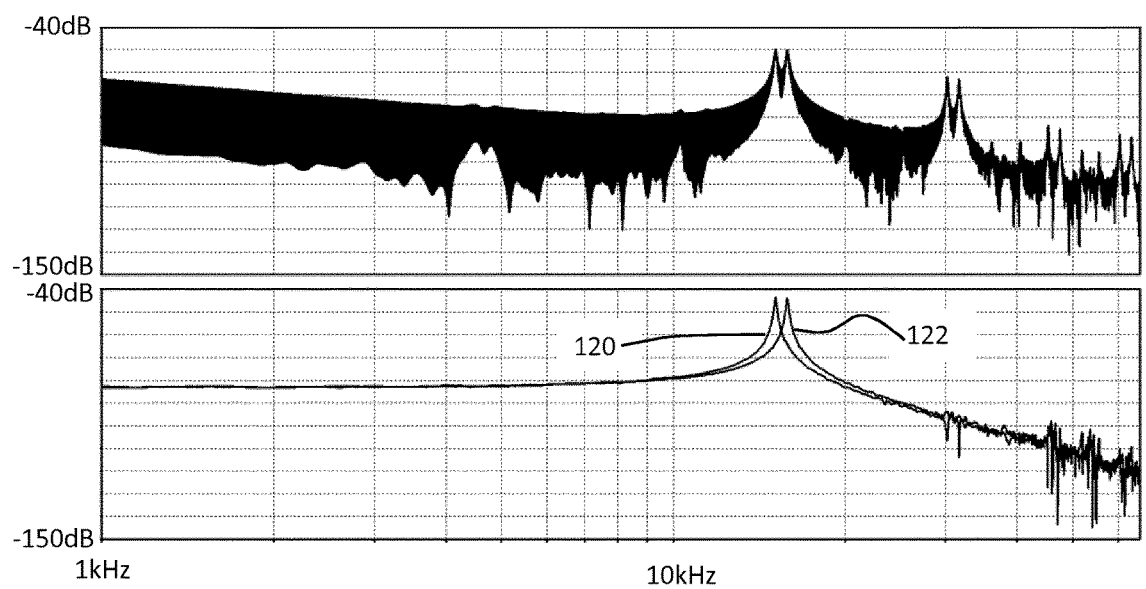
FIG. 10 shows a frequency plot of the output signal of the two sensors of FIG. 7.

In FIG. 10, the top image shows the combined output signal as amplitude versus frequency, with logarithmic scales. The bottom image presents the single responses independently as plot 120 for the first sensor element and plot 122 for the second sensor element. A clear difference in the frequency responses, especially in the position of the center frequencies can be observed.

Figure 11:
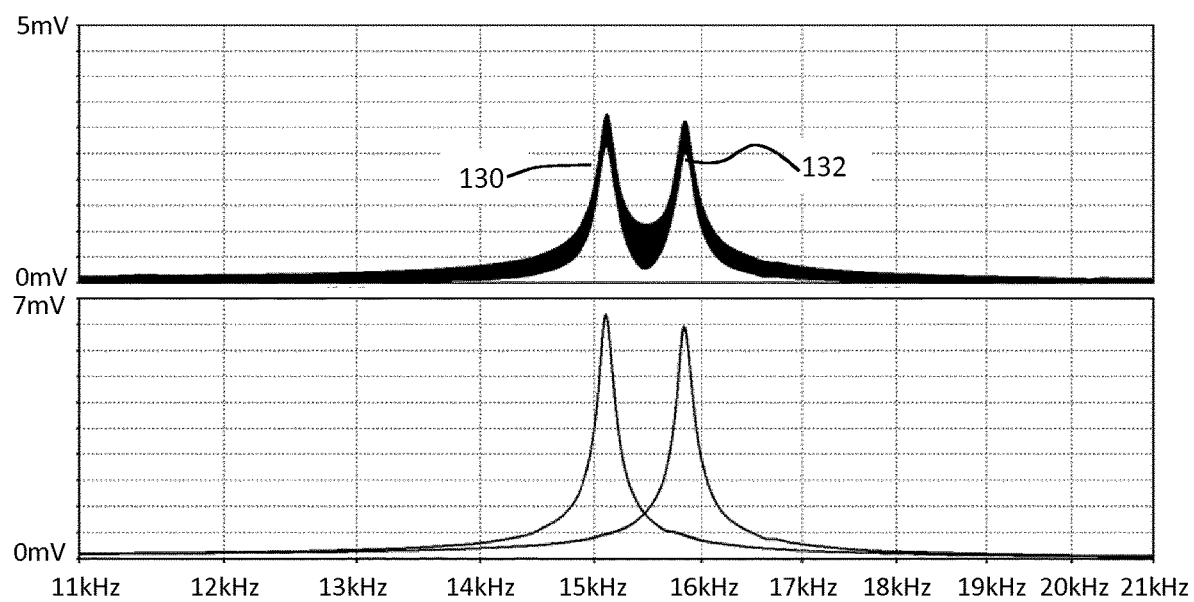
FIG. 11 shows the frequency components in the output signal of FIG. 10.

FIG. 11 shows a subset of the simulation results on linear scales. The center frequency of the first sensor element with plot 130 lies at 15.233 kHz, and the corresponding center frequency of the second sensor element with plot 132 is at 15.833 kHz, hence a difference of 700 Hz can be detected.

With reference to FIG. 7, the diodes 84, 86 for overvoltage protection may not be required if the sensor elements can withstand the high peak oscillation voltages. If the sensor elements can allow for such high over-voltages, the parallel capacitors C1, C2 may also not be used, so that only a parallel inductance is required to form the resonant circuit. Thus, the resonating circuit may be a parallel or a series resonating circuit.

The band-separation at the output may be improved by using a filter (low pass, band pass, high pass) as part of the complex load. Band-pass filters may also be used in the adding circuit.

The example above makes use of sensor elements with different electrically induced frequency response. An alternative is to provide a different frequency response by using different mechanical aspects of the sensor elements. For example, the sensor elements may display different resonance frequencies as a consequence of having different dimensions or mechanical properties (e.g. stiffness of the substrates). The sensor elements may also be designed such that pressing, releasing or tapping of the sensor element induces a resonant vibration.

Alternatively, different sensor elements may have a different mechanical relaxation or response time. For example, upon release one sensor element may return to its initial form more slowly than another, which can be identified by Fourier analysis of the trailing edge of the output signal.

The invention is concerned primarily with a sensing array. However, the invention may also be used for devices which have both a sensing function and an actuation function.

Materials suitable for the EAP layer are known. Electroactive polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Additional passive layers may be provided for influencing the behavior of the EAP layer in response to an applied electric field.

The EAP layer may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The EAP devices may be electric field driven devices or ionic devices. Ionic devices may be based on ionic polymer—metal composites (IPMCs) or conjugated polymers. An ionic polymer—metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

There are various ways to implement the sensing function, depending on the type of electroactive polymer used. The sensing examples above are based on sensors with a piezoelectric response, i.e. which generate an output current in response to an external input. This is a known sensor functionality for electroactive poly sensors. For example, US 2014/0139329 discloses example of the use of an electroactive polymers sensor to deliver current.

An alternative approach is to monitor an impedance change of the electroactive polymer sensor, and this for example allows sensing while actuating simultaneously.

The type of sensor functionality depends on the type of sensor. For example, the PVDF-TrFE polymer and the PVDF-TrFE-CFE polymer mentioned above are indeed piezoelectric. Moreover, the PVDF-TrFE-CFE based polymers can be configured as a (pseudo) piezoelectric material, by applying a small dc bias voltage (typically 1% of the full scale actuation voltage) and measuring the induced current that is generated by external deformation. This mechanism may be used in a device which performs sequential low voltage sensing and high voltage actuation.

Dielectric elastomers may be sensed with a small sensing ac voltage (<1% of actuation voltage) and the impedance change when externally activated is measured. This sensing approach may also be superimposed onto actuation voltages. Essentially, this will manifest itself as a current coming from the actuator (because the capacitance changes, the charge stored on the capacitor will change, manifesting itself as a current signal).

Finally, ionic polymers deliver a current when pressed, without the need for a bias voltage. This is due to physical redistribution of the ions in the actuator. More specifically, the ions near an outward bending edge will be slightly separated while the ions on an inner edge are slightly compressed. Subsequently these ions will redistribute to even the offset in electrical charge and this motion will result in a measurable sensor current (several microamperes). This effect is still present when the actuator is actuated.

The invention can be applied in many EAP sensing applications where a passive matrix array of actuators is of interest.

In many applications the main function of the product relies on the (local) sensing of human tissue, or tissue contacting interfaces. The device may thus be used for body contour or body contact sensing, and/or body contour or body contact following in wearables, image guided therapy devices and personal care products. In such applications, the invention enables the location and the shape of the contact between the device and the human body to be measured using a sensor array without complex wirings and electronics.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A sensor device comprising: a passive matrix array of electroactive sensor elements arranged in rows and columns; and an array of row lines and an array of column lines, with an electroactive sensor element at each intersection, wherein each sensor element generates a sensor signal when an external input is sensed, wherein each sensor element generates a binary sensor signal such that a total sensor array signal at each row and at each column enables any pattern of external inputs to be determined.

2. A device as claimed in claim 1, wherein each sensor element comprises a bistable element having two configurations.

3. A device as claimed in claim 1, wherein each sensor element generates a sensor current.

4. A sensor device comprising:
a passive matrix array of electroactive sensor elements wherein each sensor element generates a sensor signal when an external input is sensed,
wherein each sensor element generates a sensor signal with a different frequency characteristic such that individual sensor elements can be identified from a combined sensor signal, thereby to enable any pattern of external inputs to be determined.

5. A device as claimed in claim 4, wherein each sensor element comprises a current generating element which generates an output current in response to an external input, and a reactive load circuit which converts the output current into an output signal with a frequency characteristic.

6. A device as claimed in claim 5, wherein the reactive load circuit comprises a resonant circuit, wherein the resonant circuit of each sensor element has a different set of component values.

7. A device as claimed in claim 6, wherein the resonant circuit comprises a parallel LC circuit.

8. A device as claimed in claim 5, wherein the sensor element further comprises a diode between the current generating element and the load circuit.

9. A device as claimed in claim 4 comprising a summing circuit for summing the sensor signals.

10. A device as claimed in claim 4, wherein each sensor element has a different mechanical resonance frequency or a different mechanical relaxation time.

11. A sensing method for sensing a pattern of external inputs to a sensor device which comprises a passive matrix array of electroactive sensor elements arranged in rows and columns and an array of row lines and an array of column lines with an electroactive sensor element at each intersection, wherein the method comprises: generating a sensor signal at each sensor element when an external input is sensed, wherein the sensor element signal comprises a binary sensor signal; and from a total sensor signal at each row and at each column determining the pattern of external inputs.

12. A sensing method for sensing a pattern of external inputs to a sensor device which comprises a passive matrix array of electroactive sensor elements, with an electroactive sensor element at each intersection, wherein the method comprises: generating a sensor signal at each sensor element with a different frequency characteristic; and from a combined sensor signal, identifying individual sensor elements, thereby determining the pattern of external inputs.

13. A method as claimed in claim 12, wherein each sensor element comprises a current generating element which generates an output current in response to an external input, and wherein the method comprises converting the output current into an output signal with a frequency characteristic using a load circuit.

14. A method as claimed in claim 12 comprising summing the sensor signals and identifying the sensor elements in the summed sensor signals using frequency spectrum analysis.

15. A method as claimed in claim 12, comprising providing each sensor element with a different mechanical resonance frequency or a different mechanical relaxation time.

* * * * *